(12) United States Patent
Tu

(10) Patent No.: US 8,885,345 B2
(45) Date of Patent: Nov. 11, 2014

(54) ELECTRONIC DEVICE WITH HEAT SINK

(75) Inventor: Shun-Siang Tu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 68 days.

(21) Appl. No.: 13/593,845

(22) Filed: Aug. 24, 2012

(65) Prior Publication Data

US 2013/0155621 A1 Jun. 20, 2013

(30) Foreign Application Priority Data

Dec. 20, 2011 (TW) ................................. 100147239

(51) Int. Cl.
*H05K 7/20* (2006.01)
*H01B 9/06* (2006.01)
*F28F 7/00* (2006.01)

(52) U.S. Cl.
USPC ........................... 361/719; 165/80.1; 174/15.1

(58) Field of Classification Search
CPC .................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 2/0082; H05K 5/0021; H05K 5/0086–5/06; H05K 5/069; H05K 7/005–7/008; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01B 4/00; H01R 9/00; H01R 13/00; H01K 1/00; H01K 3/00; H02B 1/00; H01H 37/00
USPC ........................ 361/679.46–679.54, 688–723, 361/679.01–679.02, 679.26–679.28, 361/679.55–679.58; 174/15.1, 16.1–16.3; 165/80.1–80.3, 185; 257/718–719; 24/453, 458–459

See application file for complete search history.

(56) References Cited

U.S. PATENT DOCUMENTS

| 6,130,821 | A  | * | 10/2000 | Gerber ........................... 361/704 |
| 6,654,254 | B2 | * | 11/2003 | Szu et al. ...................... 361/760 |
| 6,672,374 | B1 | * | 1/2004  | Lin .............................. 165/121 |
| 6,678,160 | B1 | * | 1/2004  | Liu .............................. 361/719 |
| 6,728,107 | B2 | * | 4/2004  | Tseng et al. ................... 361/719 |
| 6,731,505 | B1 | * | 5/2004  | Goodwin et al. ............. 361/719 |
| 6,731,506 | B1 | * | 5/2004  | Dong et al. .................... 361/719 |
| 7,102,890 | B2 | * | 9/2006  | Lee et al. ...................... 361/704 |
| 7,283,368 | B2 | * | 10/2007 | Wung et al. ................... 361/719 |

(Continued)

*Primary Examiner* — Jayprakash N Gandhi
*Assistant Examiner* — Razmeen Gafur
(74) *Attorney, Agent, or Firm* — Novak Druce Connolly Bove + Quigg LLP

(57) ABSTRACT

An electronic device includes a circuit board, a tray abutting a bottom surface of the circuit board, and a heat sink attached to a top surface of the circuit board. The circuit board includes a heat generating chip, and a number of through holes defined in the circuit board. The tray includes a number of clipping members. A number of elastic members are attached to the heat sink. The number of clipping members extend through the number of through holes and engaged with the plurality of elastic members, and the number of elastic members are deformable to disengage from the number of clipping members.

9 Claims, 5 Drawing Sheets

(56) References Cited

U.S. PATENT DOCUMENTS

| | | | |
|---|---|---|---|
| 7,679,919 B2* | 3/2010 | Lee | 361/719 |
| 7,969,742 B2* | 6/2011 | Liu | 361/709 |
| 8,247,698 B2* | 8/2012 | Hwang et al. | 174/252 |
| 2005/0111196 A1* | 5/2005 | Wang et al. | 361/719 |
| 2007/0263363 A1* | 11/2007 | Liu et al. | 361/719 |
| 2009/0168349 A1* | 7/2009 | Li et al. | 361/697 |
| 2011/0110031 A1* | 5/2011 | Homer et al. | 361/679.54 |
| 2011/0164380 A1* | 7/2011 | Wu et al. | 361/688 |

\* cited by examiner

ELECTRONIC DEVICE WITH HEAT SINK

BACKGROUND

1. Technical Field

The present disclosure relates to electronic devices, more particularly to an electronic device with a heat sink.

2. Description of Related Art

Heat sink performs the critical function of removing heat from a computer system. For example, the heat sink is attached to a top surface of a CPU, to absorb heat generated from the heat generating chip. In assembly of the heat sink, a tray is secured to the heat sink, and the heat sink is secured to a circuit board by a plurality of screws. However, using screws is laborious and time-consuming. Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
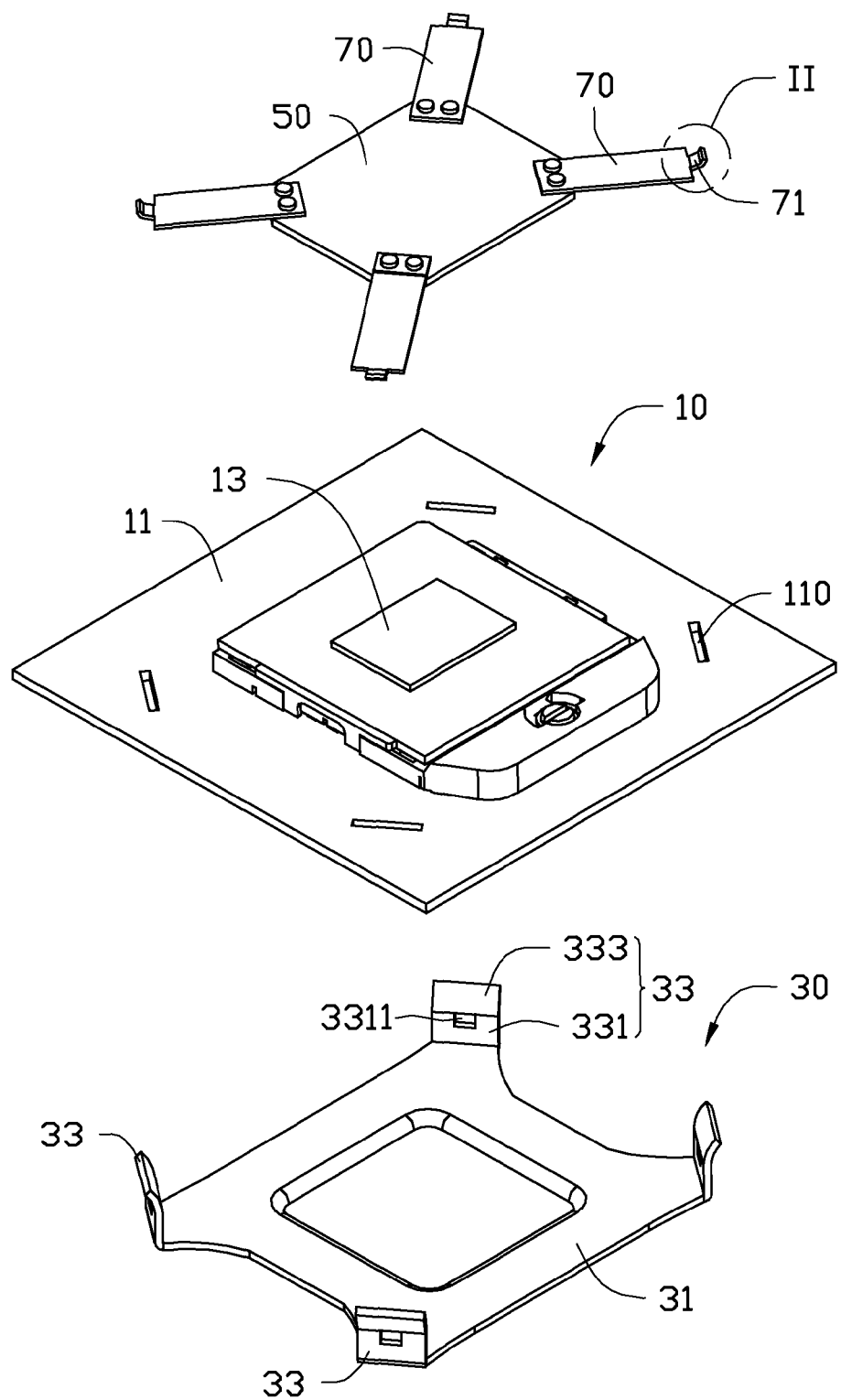
FIG. 1 is an isometric view of an electronic device in accordance with an embodiment.
Figure 2:
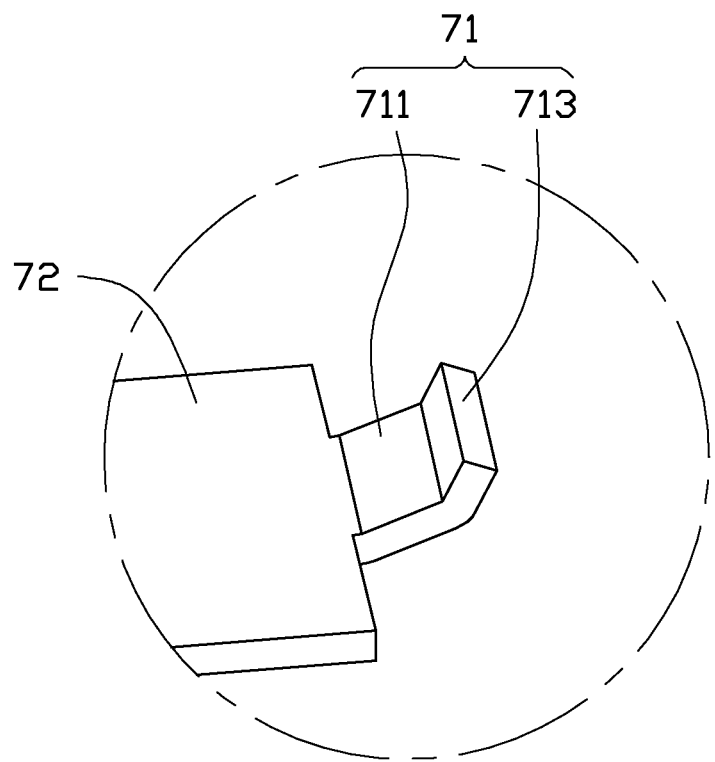
FIG. 2 is an enlarged view of circled II of FIG. 1.
Figure 3:
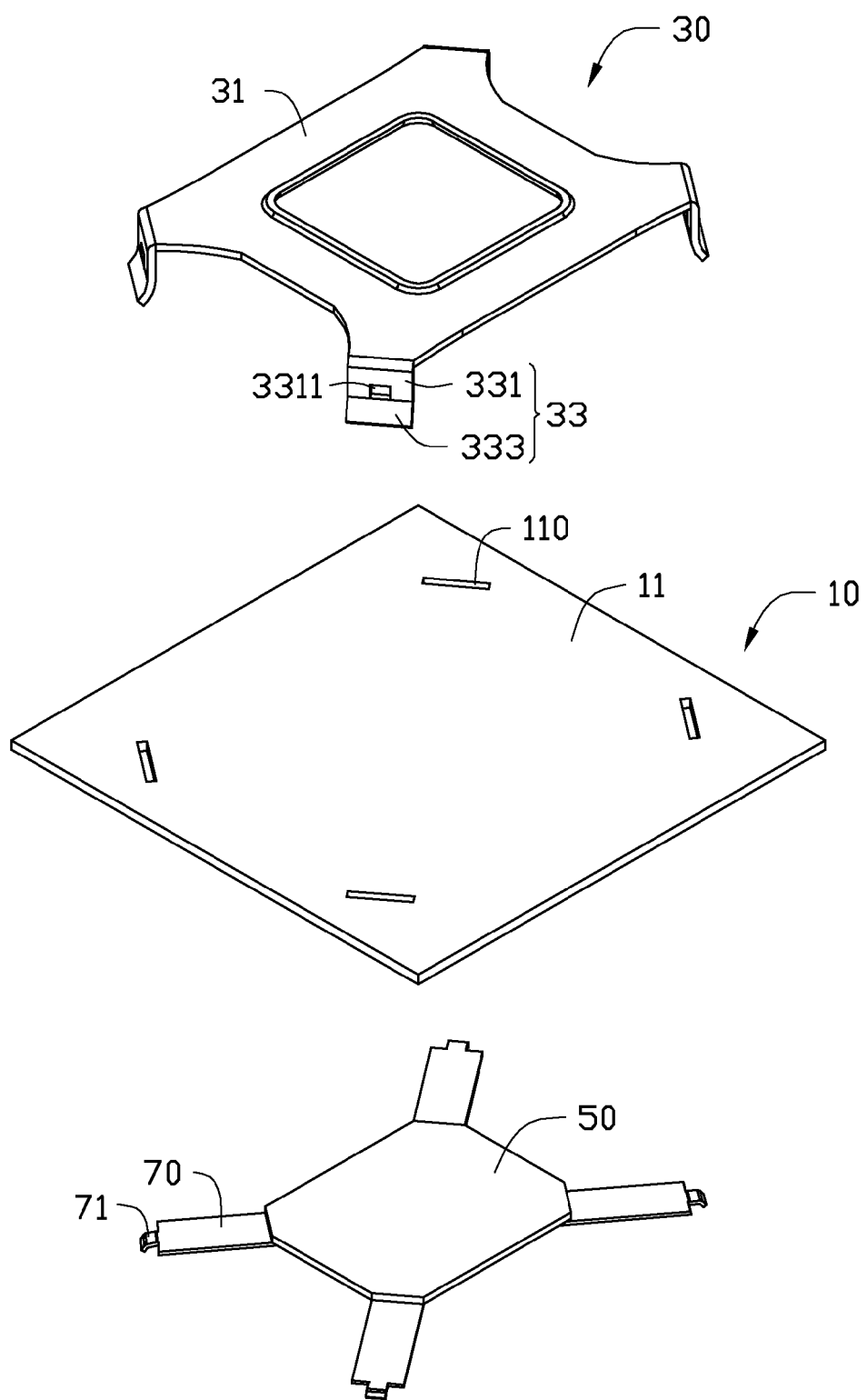
FIG. 3 is similar to FIG. 1, but viewed from a different aspect.

FIGS. 1-3 illustrate an electronic device in accordance with an embodiment. The electronic device includes a circuit board 10, a tray 30 secured to a bottom surface of the circuit board 10, a heat sink 50 attached to a top surface of the circuit board 10, and a plurality of elastic members 70 secured to the heat sink 50. In one embodiment, the heat sink 50 is a rectangle, the number of the elastic members 70 is four, and the four elastic members 70 are arranged at four corners of the heat sink 50.

The circuit board 10 includes a main body 11 and a heat generating chip 13 attached to the main body 11. Four through holes 110 are defined in the main body 11. In one embodiment, each of the four through holes 110 is a rectangle.

The tray 30 includes a base 31 and four clipping members 33 extending from the base 31. In one embodiment, the base 31 is rectangle, and the four clipping members 33 are centrosymmetric and arranged at four corners of the base 31. Each of four clipping members 33 includes a positioning portion 331 and an operating portion 333 connected to the positioning portion 331. A positioning hole 3311 is defined in the positioning portion 331 and adjacent to the operating portion 333. In one embodiment, the positioning portion 331 is substantially perpendicular to the base 31; two positioning portions 331, which are located in a diagonal line of the base 31, are substantially parallel to each other; and the operating portion 333 is substantially arcuate. An obtuse angle is defined between the positioning portion 331 and the operating portion 333.

Each of the plurality of elastic members 70 includes an elastic body 72 and a clamping portion 71 extending from a free end of the elastic body 72. The clamping portion 71 includes a connecting portion 711 connected to the elastic body 72 and an extending portion 713 extending from the connecting portion 711. In one embodiment, the connecting portion 711 is slanted relative to the elastic body 72, and an obtuse angle is defined between the connecting portion 711 and the elastic body 72. The extending portion 713 is extends at an angle relative to the connecting portion 711, and an obtuse angle is defined between the connecting portion 711 and the extending portion 713.

Figure 4:
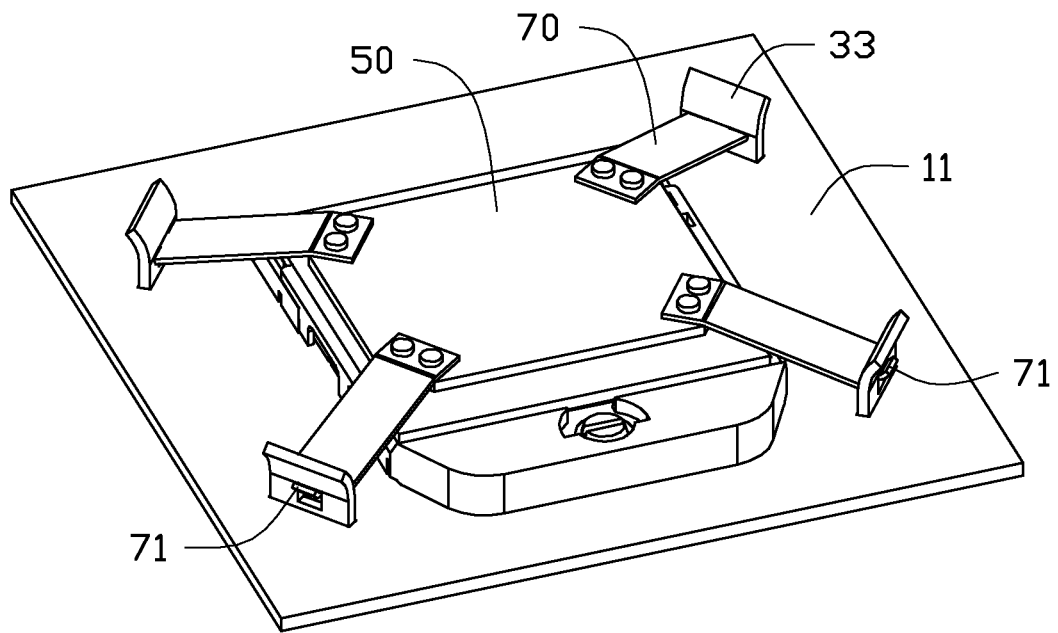
FIG. 4 is an assembled view of the electronic device of FIG. 1.
Figure 5:
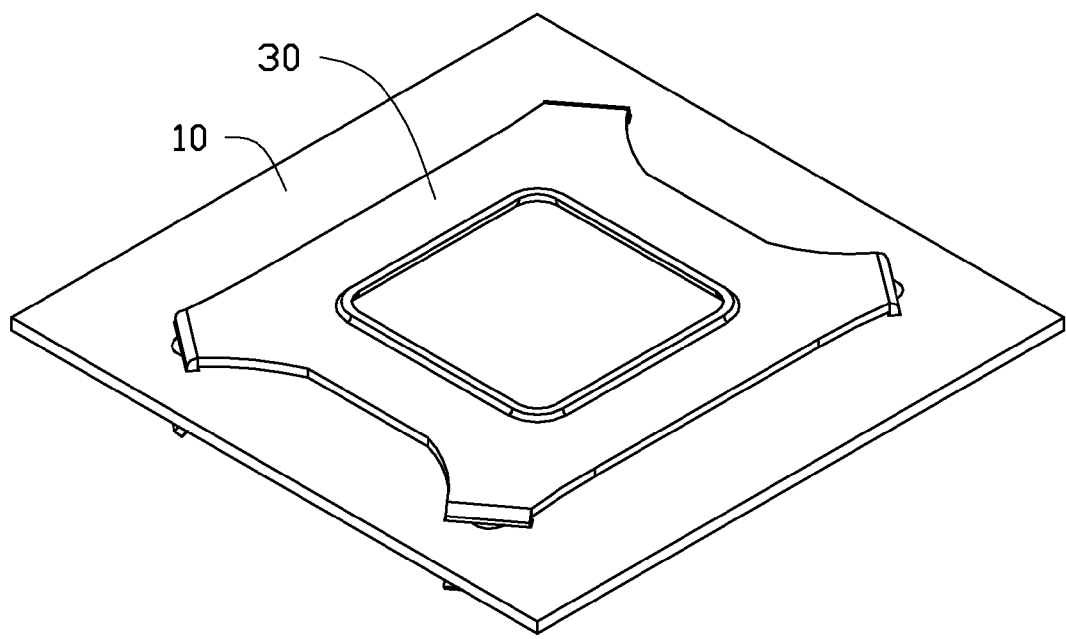
FIG. 5 is an assembled view of the electronic device of FIG. 3.

FIGS. 4-5 illustrate an assembled view of the electronic device in accordance with an embodiment. In assembly, the tray 30 abuts the bottom surface of the main body 11. The four operating portions 333 extend through the four through holes 110, and the four positioning portions 331 are engaged in the four through holes 110. Thus, the tray 30 is secured to the circuit board 10. The four positioning holes 3311 are located above the top surface of the circuit board 10. The heat sink 50 abuts the top surface of the heat generating chip 13. The elastic members 70 are deformed to engage the four extending portions 713 in the four positioning holes 3311, to secure the heat sink 50 to the heat generating chip 13.

In disassembly, the four elastic members 70 are deformed, and the four operating portions 333 are operated to disengage the four extending portions 713 from the four positioning holes 3311. Thus, the heat sink 50 can be disengaged from the circuit board 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
   a circuit board comprising a heat generating chip, and a plurality of through holes defined in the circuit board;
   a tray abutting a bottom surface of the circuit board, and the tray comprising a plurality of clipping members; and
   a heat sink attached to a top surface of the circuit board, and a plurality of elastic members are attached to the heat sink; each elastic member comprising an elastic body, a connecting portion directly extending from the elastic body, and an extending portion directly extending from the connecting portion; an obtuse angle defined between the elastic body and the connecting portion, and an obtuse angle defined between the connecting portion and the extending portion;
   wherein the plurality of clipping members extends through the plurality of through holes and engaged with the plurality of elastic members, and the connecting portions of the plurality of elastic members are deformable to enable disengagement from the plurality of clipping members.

2. The electronic device of claim 1, wherein the number of the plurality of elastic members is four, and the four elastic members are arranged at four corners of the heat sink.

3. The electronic device of claim 1, wherein each of the plurality of clipping members defines a positioning hole, each of the plurality of elastic members comprises a clamping portion, and the clamping portion is engaged in the positioning hole.

4. The electronic device of claim 3, wherein the tray comprises a base, each of the plurality of clipping members comprises a positioning portion substantially perpendicular to the base, the positioning hole is defined in the positioning portion, the positioning portion extends through the through hole, so that the positioning hole of each of the plurality of clipping members is located above the top surface of the circuit board.

5. The electronic device of claim 4, wherein each of the plurality of clipping members further comprises an operating portion extending from the positioning portion, and the operating portion is substantially arcuate.

6. The electronic device of claim 4, wherein each of the plurality of elastic members further comprises an elastic body connected to the clamping portion, and the clamping portion comprises a connecting portion engaged in the positioning hole.

7. An electronic device comprising:

a circuit board comprising a heat generating chip, and a through hole defined in the circuit board;

a tray abutting a bottom surface of the circuit board, and the tray comprising a clipping member; and the clipping member defining a positioning hole; and a heat sink attached to a top surface of the circuit board, and an elastic member attached to the heat sink and comprising an elastic body, a connecting portion directly extending from the elastic body, and an extending portion directly extending from the connecting portion; an obtuse angle defined between the elastic body and the connecting portion, and an obtuse angle defined between the connecting portion and the extending portion;

wherein the clipping member extends through the through holes to locate the positioning hole above the top surface of the circuit board, the elastic member is deformable to engage the connecting portion in the positioning hole.

8. The electronic device of claim 7, wherein the tray comprises a base, the clipping member comprises a positioning portion substantially perpendicular to the base, and the positioning hole is defined in the positioning portion.

9. The electronic device of claim 8, wherein the clipping member further comprises an operating portion extending from the positioning portion, and the operating portion is substantially arcuate.

* * * * *